United States Patent
Lewis et al.

(10) Patent No.: US 11,175,100 B2
(45) Date of Patent: Nov. 16, 2021

(54) HEAT SINKS USING MEMORY SHAPING MATERIALS

(71) Applicant: INTERNATIONAL BUSINESS MACHINES CORPORATION, Armonk, NY (US)

(72) Inventors: Theron L. Lewis, Rochester, MN (US); David J. Braun, St Charles, MN (US); Jennifer I. Bennett, Rochester, MN (US); James D. Bielick, Pine Island, MN (US); John R. Dangler, Rochester, MN (US); Timothy P. Younger, Rochester, MN (US); Stephen M. Hugo, Stewartville, MN (US); Timothy Jennings, Rochester, MN (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 210 days.

(21) Appl. No.: 16/405,051

(22) Filed: May 7, 2019

(65) Prior Publication Data
US 2020/0355442 A1  Nov. 12, 2020

(51) Int. Cl.
*F28D 15/02* (2006.01)
*F03G 7/06* (2006.01)
(Continued)

(52) U.S. Cl.
CPC .......... *F28D 15/0275* (2013.01); *B23P 15/26* (2013.01); *F03G 7/065* (2013.01);
(Continued)

(58) Field of Classification Search
CPC ...... F28D 15/0275; B23P 15/26; F03G 7/065; F28F 1/10; F28F 2255/04; H01L 21/4882;
(Continued)

(56) References Cited

U.S. PATENT DOCUMENTS 3,707,694 A * 12/1972 DuRocher .......... H01H 61/0107
337/139
4,551,974 A * 11/1985 Yaeger ................ H01H 37/323
60/527

(Continued)

FOREIGN PATENT DOCUMENTS

| JP | S62252157 A | 11/1987 |
| JP | H0983184 A | 3/1997 |
| JP | H09246439 A | 9/1997 |

*Primary Examiner* — Ryan J. Walters
(74) *Attorney, Agent, or Firm* — Gregory M. Nordstrom

(57) ABSTRACT

A heat sink assembly can comprise a heat sink and a shaping element made of a shape memory material. The shaping element is incorporated into the heat sink assembly in an assembly shape. An actuation energy can cause the shape memory material to change the shaping element to an actuation shape, and the actuation shape can produce a thermal coupling shape in the heat sink. A method comprises forming a shaping element, of a shape memory material, into an actuation shape. The method includes re-forming the shaping element from the actuation shape into an assembly shape and incorporating the shaping element in a heat sink assembly that includes a heat sink. In the method, applying an actuation energy causes the shape memory material to change the shaping element from the assembly shape to the actuation shape to produce a thermal coupling shape in the heat sink.

10 Claims, 5 Drawing Sheets

(51) Int. Cl.
*F28F 1/10* (2006.01)
*B23P 15/26* (2006.01)
*H01L 23/433* (2006.01)
*H01L 23/40* (2006.01)
*H01L 21/48* (2006.01)
*H01L 23/367* (2006.01)

(52) U.S. Cl.
CPC ............... *F28F 1/10* (2013.01); *H01L 23/40* (2013.01); *H01L 23/433* (2013.01); *F28F 2255/04* (2013.01); *H01L 21/4882* (2013.01); *H01L 23/3677* (2013.01)

(58) Field of Classification Search
CPC ... H01L 23/3677; H01L 23/433; H01L 23/40; H01L 23/427
See application file for complete search history.

(56) References Cited

U.S. PATENT DOCUMENTS

| | | | |
|---|---|---|---|
| 4,556,934 A * | 12/1985 | Lemme | F03G 7/065 |
| | | | 337/140 |
| 4,765,139 A | 8/1988 | Wood | |
| 5,010,949 A * | 4/1991 | Dehaine | H01L 23/4006 |
| | | | 165/185 |
| 6,126,371 A * | 10/2000 | McCloskey | B64G 1/641 |
| | | | 411/544 |
| 6,278,607 B1 | 8/2001 | Moore et al. | |
| 7,080,989 B2 | 7/2006 | Gates | |
| 8,385,066 B2 | 2/2013 | Chang et al. | |
| 10,231,360 B2 * | 3/2019 | Howe | H05K 7/20518 |
| 2005/0230082 A1 | 10/2005 | Chen | |
| 2018/0132383 A1* | 5/2018 | Howe | F25D 5/00 |
| 2018/0305043 A1 | 10/2018 | Mindock et al. | |
| 2018/0340743 A1 | 11/2018 | Poltorak | |

* cited by examiner

HEAT SINKS USING MEMORY SHAPING MATERIALS

BACKGROUND

The present disclosure relates to heat sinks, and more specifically, to a heat sink assembly using a shape memory material.

SUMMARY

According to embodiments of the present disclosure (hereinafter, "embodiments"), a heat sink assembly can comprise a heat sink and a shaping element. The shaping element can comprise a shape memory material and have an actuation shape and an assembly shape. In embodiments, a shape memory material can be a metal alloy having a shape memory property. An actuation shape of a shaping element can be a convex shape, a concave shape, an extended spring, or a dome shape.

The shaping element can be coupled to the heat sink, within the heat sink assembly, in the assembly shape. In response to an actuation energy applied to shaping element, the shape memory material can change the shaping element from the assembly shape to the actuation shape. The heat sink assembly can be configured such that the shaping element changing from the assembly shape to the actuation shape exerts a shaping force on the heat sink. The heat sink assembly can be further configured such that the shaping force exerted on the heat sink produces a thermal coupling shape in the heat sink. In embodiments, the actuation energy can be applied one or more of the shaping element, the heat sink, the heat sink assembly, and a heat source coupled to the heat sink assembly, and the activation energy can be one or more of heat, electrical energy, mechanical energy, and magnetic energy.

Additionally, in an embodiment a heat sink assembly can comprise heat pipe heat sink and a shaping element. The heat pipe heat sink can have a heat sink base and a heat pipe. The heat pipe can comprise a coolant pipe and a heat pipe base coupled to the heat sink. The shaping element can comprise a shape memory material and can be included in heat sink assembly in an assembly shape and coupled to the heat pipe base. The shape memory material can change the shaping element from the assembly shape to an actuation shape in response to an actuation energy applied to shaping element. The heat sink assembly can be configured such that the shaping element changing from the assembly shape to the actuation shape exerts a shaping force on the heat pipe base; and such that the shaping force exerted on the heat pipe base produces a thermal coupling shape in the heat sink base.

Embodiments can include a method for coupling a heat sink and a heat source, in which the method comprises forming a shaping element into an actuation shape. In embodiments the shaping element can comprise a shape memory material, and the actuation shape can be a convex shape, a concave shape, an extended spring, or a dome shape. The method includes re-forming the shaping element from the actuation shape into an assembly shape suitable for incorporating the shaping element in a heat sink assembly. The method further comprises coupling the shaping element to the heat sink within the heat sink assembly and coupling the heat sink assembly to the heat source. According to the method, applying an actuation energy to the shaping element causes the shape memory material to change the shaping element from the assembly shape to the actuation shape. In embodiments of the method, the actuation energy can be heat, electrical energy, mechanical energy, and magnetic energy. The shaping element changing from the assembly shape to the actuation shape can produce a thermal coupling shape in the heat sink. In some embodiments, the method includes coupling the heat sink to the heat source using a Thermal Interface Material (TIM) and, in the method, applying the actuation energy can comprise heating the TIM to a cure temperature higher than an actuation temperature of the shape memory material of the shaping element.

The above summary is not intended to describe each illustrated embodiment or every implementation of the present disclosure.

BRIEF DESCRIPTION OF THE DRAWINGS

The drawings included in present disclosure (hereinafter, "the disclosure") are incorporated into, and form part of, the specification. They illustrate embodiments of the disclosure and, along with the description, serve to explain the principles of the disclosure. The drawings are only illustrative of certain embodiments and do not limit the disclosure.

Figure 1A:
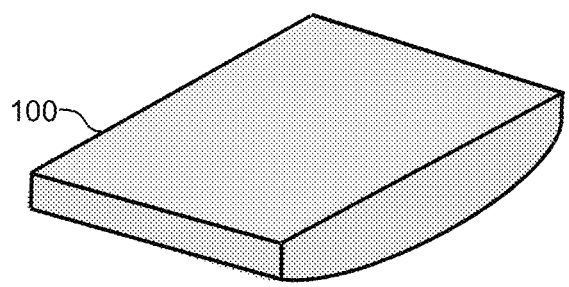
FIG. 1A illustrates an actuation shape of a shaping element, according to aspects of the disclosure.

While the disclosure is amenable to various modifications and alternative forms, specifics thereof have been shown by way of example in the drawings and will be described in detail. It should be understood, however, that the intention is not to limit the disclosure to the particular embodiments described. On the contrary, the intention is to cover all modifications, equivalents, and alternatives falling within the spirit and scope of the disclosure.

DETAILED DESCRIPTION

Aspects of the present disclosure (hereinafter, "the disclosure") relate to thermally coupling heat sinks to heat sources, more particular aspects relate to using memory shaping materials in shaping elements to thermally couple heat sinks to heat sources. While the disclosure is not necessarily limited to such applications, various aspects of the disclosure may be appreciated through a discussion of various examples using this context.

In embodiments of the disclosure (hereinafter, "embodiments") a "heat sink" can be any device and/or material, or assembly of devices and/or materials, utilized to transfer heat from one element of a system (e.g., an electronic or mechanical device) to a medium (e.g., a gas, a liquid, and/or a solid material) that can radiate the heat away from the heat sink. In embodiments, such a heat sink can transfer heat away from a heat source. In some embodiments a heat sink can transfer heat from a particular electronic or mechanical component of a system to another, particular electronic or mechanical component of that system.

In embodiments, a heat sink can comprise, for example, a solid comprising a thermally conductive material, such as a metal, or other material, having good thermal conduction properties. A heat sink, in embodiments, can be formed in a geometry that can dissipate heat to another medium (e.g., a gas, liquid, or other solid) in contact with the heat sink, and a heat sink geometry can have a large surface area to dissipate heat into such a medium. As will be seen in the example embodiments to follow, heat sinks can include chambers, or cavities, that can contain a coolant to conduct heat away from a heat sink, and/or a heat source thermally coupled to a heat sink.

A heat source, in embodiments, can comprise, for example, an electronic device—such as a transistor, a transformer, or a processor or integrated circuit—that can generate heat, such as while the device is operating. In alternative embodiments, a heat source can comprise a mechanical device—such as a gear, a piston, or a shaft—that can generate heat while operating (e.g., due to friction). A "heat sink assembly", in an embodiment, can comprise a heat sink coupled with other elements and/or materials that can aid in mechanically and/or thermally coupling a heat sink and a heat source.

"Thermal coupling", as used herein, refers to any form of coupling between a heat source and a heat sink that effects thermal conductivity (i.e., heat transfer) from the heat source to the heat sink. Thermal coupling, in embodiments, can comprise, for example, direct contact between one or more surfaces of a heat sink and one or more surfaces of a heat source. Other forms of thermal coupling, in embodiments, can include intermediary materials (e.g., a Thermal Interface Material, or "TIM") interspersed between a heat source and a heat sink, and/or devices coupled to a heat source and a heat sink (e.g., plates or rods), so as to provide for thermal conductivity between the heat source and the heat sink "Thermal efficiency" of a heat sink, as used herein, refers to the efficiency of heat transfer, in a thermal coupling, from a heat source to a heat sink. In an embodiment, thermal efficiency of a heat sink can be affected by the quality of a thermal coupling between a heat sink and a heat source. For example, in embodiments, a thermal coupling comprising a surface of a heat sink in direct contact with a surface of a heat source. In this example, the quality of thermal coupling between the heat sink and heat source, and the corresponding thermal efficiency of the thermal coupling, can vary according to the degree to which the surfaces make direct contact. Voids, or gaps, between the surfaces can reduce the quality of thermal coupling between the heat sink and heat source, thereby reducing thermal efficiency of the thermal coupling. For example, air (or, another gas or a liquid) can fill voids or gaps between the surfaces of a heat source and heat sink, and the air may not transfer heat from the heat source to the heat sink as efficiently as the heat sink surface in direct contact with the heat source surface at the locations of those voids or gaps. Accordingly, the voids and/or gaps can reduce the quality of the thermal coupling between the heat source and heat sink, by reducing thermal efficiency of the thermal coupling where voids and/or gaps occur.

In some embodiments, a TIM can be interspersed between, and/or around, surfaces of a heat sink and a heat source to improve thermal coupling, and corresponding thermal efficiency of a thermal coupling between the heat source and heat sink. As described in the foregoing example of a direct contact thermal coupling, voids or gaps between the TIM and a heat sink surface, and/or between the TIM and a heat source surface, can reduce the thermal efficiency, and corresponding quality, of the thermal coupling between the heat source and the heat sink.

Also, in embodiments, particular regions of a heat source can generate more heat than other regions of a heat source. For example, in an electronic processor integrated circuit, regions of the processor that operate at higher clock frequencies, or perform a higher number or rate of computations, can generate more heat than regions of the processor that operate at lower clock frequencies, or perform fewer number or rate of computations. Accordingly, in such an embodiment improving thermal coupling between a heat sink and those regions of a heat source that generate more heat (e.g., by directing a thermal coupling more to "hotter" regions of a heat source) can improve thermal efficiency of the thermal coupling.

In embodiments, a heat sink assembly can combine a heat sink with a "shaping element" to improve a thermal coupling between the heat sink and a heat source. A shaping element, in embodiments, can comprise a "shape memory material" to dynamically modify the shape of the shaping element and heat sink in a heat sink assembly. For example, in an embodiment a heat sink assembly utilizing a shaping element can improve thermal coupling between a heat source and a heat sink by, for example, by modifying the shape of the heat sink to increase areal surface contact, and/or direct one or more locations of contact, between the heat sink and a heat source.

Shape memory materials, in embodiments, can comprise materials that can be formed in one "actuation" shape and re-formed in an alternative shape. When subjected to a particular energy (e.g., heat, electrical, mechanical, and/or magnetic energy), an element comprising the shape memory material can transform shape from the re-formed shape to the actuation shape. In embodiments, a shaping element comprised of a shape memory material and formed in a particular actuation shape can, in response to an "actuation energy", transform from a re-formed shape to the actuation shape. In embodiments an actuation energy applied to a heat sink, a heat sink assembly or element thereof, and/or a heat source can be transferred to a shaping element to cause a shape memory material, used in the shaping element, to transform the shaping element from a re-formed shape to an actuation shape.

In an embodiment a shape memory material can comprise, for example, a metal alloy, such as nitinol, copper-aluminum-nickel, and/or nickel-titanium. However, this is not intended to limit embodiments, and in an embodiment a shaping element can comprise any material having shape memory properties, such as organic and/or inorganic compounds that can have shape memory properties. The form and amount of actuation energy to transform a shaping element from a re-formed shape to an actuation shape, in embodiments, can be determined based on the particular shape memory material used in the shaping element of the heat sink assembly. For example, nitinol has a shape memory response (i.e., transforms from a re-formed, assembly shape to an actuation shape) when heated to an "actuation temperature" of between 90 and 110 (inclusive) degrees centigrade. In response to heating a shaping element comprising nitinol to a temperature within this actuation range, in an embodiment the nitinol shape memory material can transform the shaping element from a re-formed shape to an actuation shape. Other shape memory materials, in embodiments, can have an activation energy corresponding to a voltage, current, mechanical, and/or magnetic energy that causes the shape memory material to transform from a re-formed shape to an actuation shape.

In embodiments a shaping element, in a heat sink assembly, transforming to an actuation shape can correspondingly produce a "thermal coupling shape" in a heat sink (e.g., in a surface or region of a heat sink). As used herein, "thermal coupling shape" refers to any shape and/or configuration of a heat sink, within a heat sink assembly, that affects and/or improves the quality of a thermal coupling (e.g., improves thermal conductivity) between a heat source and the heat sink. For example, in embodiments a shaping element can be formed of a shape memory material in a particular actuation shape, such as (for example) a flat, or smooth, top and/or bottom surface or, alternatively, a convex top and/or bottom surface. Such a shaping element can, in embodiments be re-formed into an "assembly shape" and incorporated, in the assembly shape, into a heat sink assembly. An assembly shape of a shaping element, in an embodiment, can be any shape and/or configuration of a shaping element suitable for combining or coupling the shaping element with other elements or components of a heat sink assembly. In embodiments, an assembly shape of a shaping element can be a shape of the shaping element, in a heat sink assembly, in which the shaping element need not, and/or should not, have a particular actuation shape (e.g., manufacture and/or storage of a heat sink assembly prior to coupling to a heat source).

In an embodiment, an actuation energy applied to, and/or transferred to (e.g., from elements of the heat sink assembly, a TIM, and/or the heat source) a shaping element of a heat sink assembly can cause the shaping element to transform from the assembly shape to the actuation shape. The shaping element taking the actuation shape can modify the shape of a surface, and/or region, of a heat sink (or, heat sink material) to produce a shape of the heat sink that can improve thermal coupling between the heat sink and a heat source.

To illustrate, FIG. 1A depicts a 3-dimensional view of example shaping element 100 formed in a convex, or "dome", actuation shape. In an embodiment, shaping element 100 can include a shape memory material, such as previously described, and applying an actuation energy (e.g., heat) to shaping element 100 can cause it to transform form a re-formed shape to the dome actuation shape. In embodiments, such a dome shape of a shaping element, in a heat sink assembly, can produce a thermal coupling shape in a heat sink so as to improve the quality of a thermal coupling between the heat sink and a heat source.

A shaping element can be formed in an actuation shape, such as the dome shape illustrated by shaping element 100 in FIG. 1A, by methods such as forming the material, at a high temperature, on a fixture having a particular (e.g., the dome shape in FIG. 1A) actuation shape. While FIG. 1A illustrates shaping element 100 having a dome shape, in embodiments shaping element 100 can have alternative shapes, such as a concave shape (e.g., a shape that can follow the curvature of an axle in a mechanical assembly) and/or other shapes that can effect a transformation in shape and/or configuration of a heat sink region or surface to improve thermal coupling between the heat sink and a heat source, according to the respective geometries of the heat sink and/or heat source.

Figure 1B:
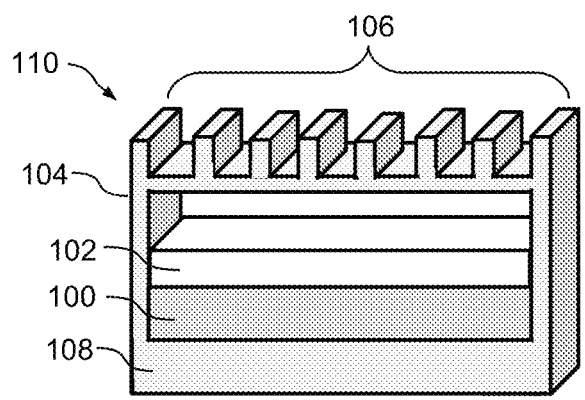
FIG. 1B illustrates a heat sink assembly, according to aspects of the disclosure.

FIG. 1B illustrates a 3-dimensional view of example heat sink assembly 110 utilizing shaping element 100 of FIG. 1A. As will be seen from the description of FIG. 1C, in embodiments a heat sink assembly, such as the example of FIG. 1B, can improve thermal coupling between a heat sink and a heat source. In FIG. 1B, heat sink assembly 110 comprises shaping element 100 in an assembly shape (i.e., a flat plate). While this particular example assembly shape is not intended to limit embodiments, in an embodiment heat sink assembly 110 in this configuration, and with shaping element 100 in a plate shape, can be suitable for coupling to a heat source.

Heat sink assembly 110 is shown further comprising heat sink 104 and load plate 102. Heat sink 104 comprises heat sink base 108 and an array of "fins", fins 106. In embodiments fins, such as 106, can be coupled to elements of a heat sink and can increase the surface area of a heat sink, such as 104, to radiate heat away from the heat sink. Heat sink base 108 can be configured, in an embodiment, to contact a heat source in a thermal coupling with that heat source.

Heat sink base 108, and/or other elements of heat sink 104, in embodiments, can comprise, for example, any material (e.g., metal) having thermal conductivity properties suitable for transferring heat away from a heat source in a particular application (e.g., transferring heat away from an electronic component of an electronic circuit within the constraints of, for example, air flow over fins of a heat sink). Additionally, in embodiments, a heat sink, and/or a heat sink base, such as the example of heat sink 104, can be "deformable", to transform to a thermal coupling shape in response to a force exerted on the heat sink (or, a heat sink base) by a shaping element (or, alternatively, a for exerted by an element of a heat sink or heat sink assembly coupled to a shaping element).

In embodiments, in FIG. 1B shaping element 100 in heat sink assembly 110 can have been formed in the dome actuation shape illustrated in FIG. 1A, and subsequently re-formed in the plate assembly shape depicted in FIG. 1B, for assembly with heat sink 104 and load plate 102 in heat sink assembly 110. In an embodiment, a load plate, such as 102, can operate as a base to mount, or configure, a shaping element, and/or other elements, within a heat sink assembly. In such an embodiment, a load plate, such as 102, can serve as a base or structure for a shaping element, such as 100, to exert a shaping force on a surface or region of a heat sink, such as 104.

Alternatively, a heat sink assembly need not include a load plate, such as 102, and in an embodiment a shaping element, such as 100, can be mounted on an alternative element. In an embodiment, a heat sink need not exert a shaping force using a load plate as a base for the force, and an alternative element (e.g., a surface of a heat sink or other element of a heat sink assembly) can serve as a base for a shaping element to exert a shaping force. For example, in an embodiment heat sin assembly can omit load plate 102, and/or the bottom surface of the array of fins 106, of heat sink 104, can serve as a base for shaping element 100 to exert a shaping force on heat sink base 108 of heat sink 104.

Figure 1C:
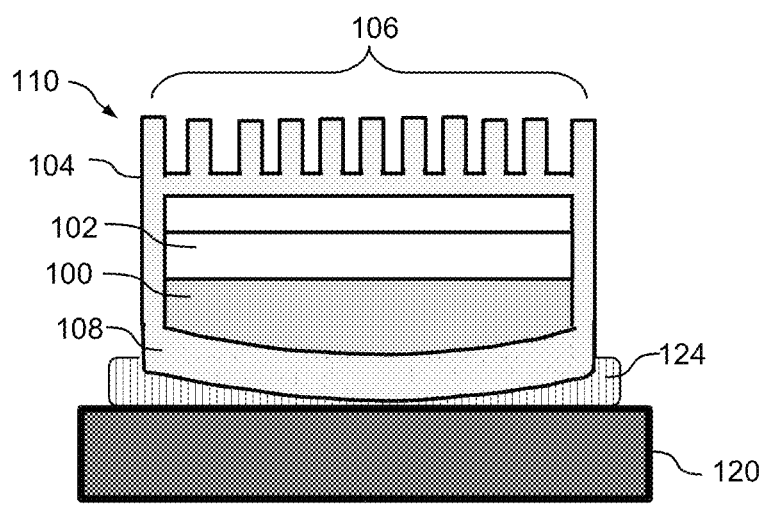
FIG. 1C illustrates a heat sink assembly in an actuation shape of a shaping element, according to aspects of the disclosure.

In embodiments, a heat sink assembly, such as 110 in FIG. 1B, can be coupled, in an assembly configuration such as illustrated by FIG. 1B, to a heat source. Applying (or, alternatively, transferring by various means in a particular application) an actuation energy to a shaping element, such as 100 in heat sink assembly 110, can produce a thermal coupling between the heat sink (e.g., heat sink base 108) and the heat source. FIG. 1C illustrates a side view of heat sink assembly 110, of FIG. 1B, thermally coupled to a heat source, component 120, with shaping element 100 in a dome actuation shape and heat sink base 108 in a thermal coupling shape. In an embodiment, component 120 can be, for example, an electronic and/or a mechanical device, or a component thereof, that generates heat to be dissipated by heat sink 104 in heat sink assembly 110. FIG. 1C further illustrates TIM 124 interspersed (e.g., as a film or paste) between heat sink assembly 110 and component 120.

While the side view of component 120 in FIG. 1C may suggest a rectilinear shape of component 120, this is not intended to limit embodiments and the geometry of component 120 can be any geometry according to the application (for example, component 120 can have a circular, oval, cylindrical, or conical geometry, such as that of a region or surface of a mechanical gear or shaft). Similarly, in an embodiment TIM 124 can be any thermal interface material suitable for a particular application and can be interspersed between, or otherwise in contact with, various surfaces of heat sink 104 and device 120, not limited to the example of TIM 124 as depicted in FIG. 1C.

As previously described, in embodiments a shape memory material, included in a shaping element, can change a shaping element from an assembly shape to an actuation shape in response to an actuation energy applied to, and/or transferred to, the shaping element. An embodiment can apply an actuation energy the shaping element itself, the heat sink assembly as a whole or another element of the heat sink assembly, a heat source coupled to the heat sink assembly, and/or a TIM, so long as the actuation energy is transferred, in some form, to the shape memory material of the shaping element.

For example, with reference to FIG. 1C, shaping element 100 can comprise a shape memory material that transforms shaping element 100 to the actuation shape of FIG. 1A when heated to an actuation temperature. In FIG. 1C, heating heat sink assembly 110, load plate 102, heat sink base 108, heat sink 104, shaping element 100, component 120, or a combination of these, to a temperature above an actuation temperature of shaping element 100 can transfer heat to shaping element 100 to cause the shape memory material of shaping element 100 to change from the plate assembly shape of FIG. 1B to the dome actuation shape of FIG. 1A.

To continue this example, FIG. 1C, further illustrates TIM 124 interspersed between (coupled with) heat sink 104 and device 120. In an embodiment a TIM can have a "cure" temperature, and the cure temperature of the TIM can be a temperature at or above an actuation temperature of a shape memory material (e.g., at or above a nitinol actuation temperature of 90 degrees centigrade). Accordingly, with reference to FIG. 1C, TIM 124 can have a cure temperature higher than an actuation temperature of a shape memory material of shaping element 108. Heating TIM 124 (and/or TIM 124 in combination with component 120 and/or elements of heat sink assembly 110) to the cure temperature of TIM 124 can transfer heat to shaping element 100, causing the shape memory material of shaping element 100 to transform shaping element 100 from the plate assembly shape of FIG. 1B to the dome actuation shape of FIG. 1A.

As previously described, a shaping element transforming to an actuation shape can produce a corresponding change in shape and/or configuration of a heat sink (i.e., produce a thermal coupling shape in the heat sink) to effect and/or improve a thermal coupling between the heat sink and a heat source. As illustrated in the example embodiment of FIG. 1C, shaping element 100 transforming from the plate assembly shape of FIG. 1B to the dome actuation shape of FIG. 1A can exert a shaping force on heat sink base 108 that can produce a corresponding dome thermal coupling shape in heat sink base 108. For example, as shaping element 100 transforms from the plate assembly shape to the dome actuation shape, shaping element 100 can exert a force between load plate 102 (and/or, alternatively, against the base of the array fins 106 of heat sink 104) and the upper surface of heat sink base 108 to produce the dome thermal coupling shape of heat sink base 108 shown in FIG. 1C.

The dome thermal coupling shape of heat sink base 108 depicted in FIG. 1C can, in turn, direct contact between heat sink 104 and TIM 124, and/or component 120, along a linear or, alternatively, circular (e.g., in the case that the actuation shape of shaping element is a spherical dome, versus the elongated dome illustrated in the example shape of shaping element 100 in FIG. 1A) region of TIM 124 and/or component 120. In the example of component 120 comprising an electronic integrated circuit, directing contact between heat sink base 108 of heat sink 104 and component 120 to a particular linear, or circular, region of component 120 can improve thermal coupling between heat sink 104 and a higher temperature region of component 120 (as compared to other regions of the surface of component 120 in contact with TIM 124 and/or heat sink 104).

While FIG. 1C may suggest an apex of the dome shape of shaping element 100, and/or heat sink base 108, located along a linear, central axis (or, in a circular dome shape, a circular center) of a shaping element and/or heat source, this is not intended to limit embodiments. It would be apparent to one of ordinary skill in the art that an actuation shape of a shaping element can produce a thermal coupling shape in a heat sink directed along any particular axis, axes, and/or points of the shaping element and/or heat sink.

Figure 2A:
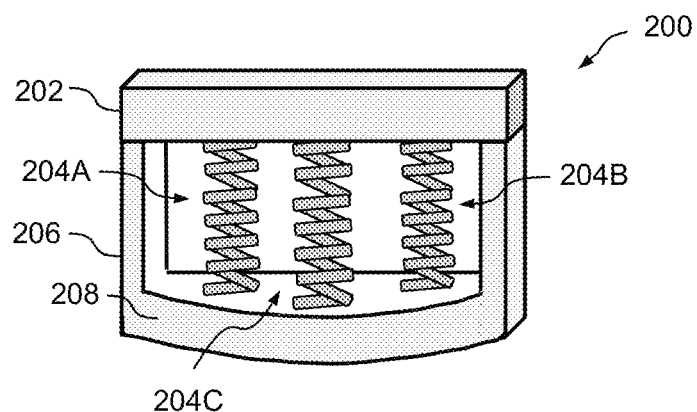
FIG. 2A illustrates an example coolant chamber heat sink and shaping element, according to aspects of the disclosure.

FIG. 2A illustrates a 3-dimensional view of an alternative example heat sink assembly utilizing a shaping element comprising a memory shaping material in an alternative assembly and actuation shape, according to aspects of the disclosure. In embodiments, a heat sink assembly, such as illustrated by the example embodiment of FIG. 2A, can effect and/or improve a thermal coupling between a heat sink and a heat source.

In FIG. 2A, heat sink assembly 200 comprises load plate 202, heat sink 206, and springs 204A, 204B, and 204C (collectively "springs 204"). Heat sink 206 comprises heat sink base 208. In embodiments, springs among springs 204 can comprise a shape memory material and can, individually or collectively, comprise a shaping element (referred to hereinafter as "shaping element 204") within heat sink assembly 200. As previously described in reference to FIG. 1B, in embodiments a load plate can operate as a base to mount a shaping element within a heat sink assembly, and/or for a shaping element to exert a shaping force on a surface or region of a heat sink. In example heat sink assembly 200 of FIG. 2A, load plate 202 can serve as a base against which springs, included in shaping element 204, can press to exert a shaping force against heat sink base 208 to produce a thermal coupling shape, such as the convex shape of heat sink base 208 illustrated in FIG. 2A, in heat sink 206.

In embodiments, heat sink 206 can comprise a material having thermal conduction properties, such as a solid metal and/or other thermally conductive material. Alternatively, in embodiments, heat sink 206 can comprise, for example, a "coolant chamber" heat sink. In such a coolant chamber heat sink, heat sink 206 can include one or more chambers to contain a coolant, such as vapor or liquid, that operates within the heat sink, and/or heat sink assembly, to transfer heat from a heat source to a heat dissipating medium (e.g., a condensing coil and/or radiator through which the coolant can flow to dissipate heat transferred by heat sink 206 from a heat source).

In the example embodiment of FIG. 2A springs 204 are depicted as having an extended actuation shape. In embodiments, in an actuation shape springs in a shaping element can be of the same actuation shape (e.g., the same extended length) or, alternatively some springs can have a different actuation shape (e.g., a shorter extended length) than other springs forming a shaping element. For example, in FIG. 2A, in an embodiment springs in the central portion of heat sink assembly 200, such as 204C, can have a longer length in an actuation shape than the actuation shape length of springs towards the outer edges of heat sink assembly 200, such as 204A and 204B. In an embodiment, such a configuration of springs having differing length extended actuation shapes can produce a convex thermal coupling shape in a heat sink base, such as 208 in the example of FIG. 2A.

Figure 2B:
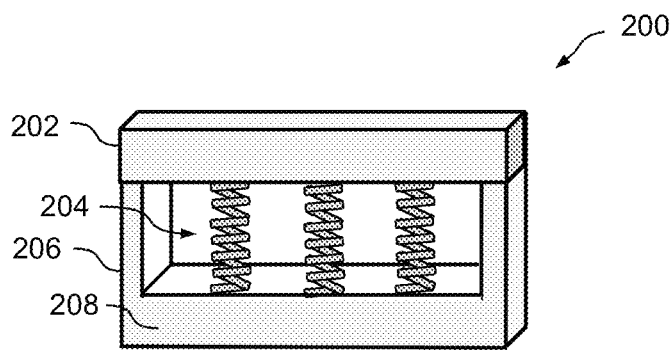
FIG. 2B illustrates an example coolant chamber heat sink and shaping element in an assembly shape, according to aspects of the disclosure.

FIG. 2B depicts a 3-dimensional view of example heat sink assembly 200, of FIG. 2A, having springs 204, comprising shaping element 204, in an assembly shape. In an embodiment, such a configuration of heat sink assembly 200, having springs 204 in an assembly shape can be suitable for coupling to a heat source. In FIG. 2B, springs 204 are depicted in a compressed assembly shape. Accordingly, as shown in FIG. 2B, in an embodiment heat sink base 208 of heat sink 206, with springs 204 in the compressed assembly shape, can have a shape other than that depicted in FIG. 2A (with springs 204 in an extended, actuation shape), such as the flat shape illustrated by the example of FIG. 2B.

Figure 2C:
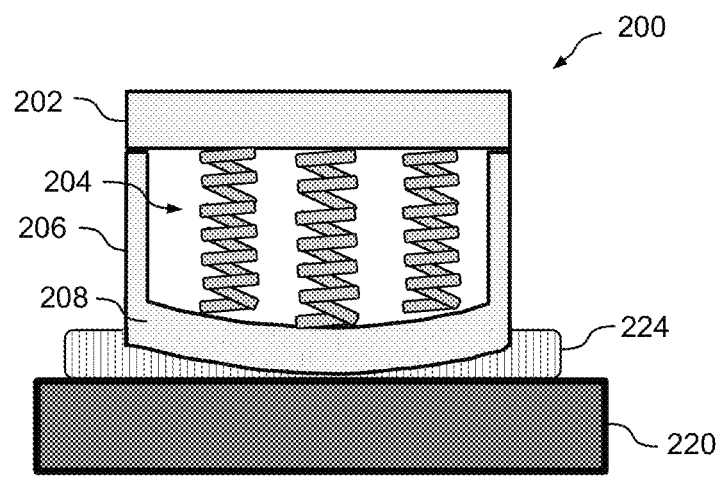
FIG. 2C illustrates an example coolant chamber heat sink assembly and shaping element in an actuation shape, according to aspects of the disclosure.

FIG. 2C is a side view illustrating heat sink assembly 200, of FIG. 2A, thermally coupled to component 220. As previously described in reference to component 120 of FIG. 1C, in an embodiment component 220 can be, for example, an electronic and/or a mechanical device, or a component thereof, that generates heat to be dissipated by heat sink 206 in heat sink assembly 200. Similar to device 120 of FIG. 1C, in an embodiment component 220 in FIG. 2C can be any geometry according to a particular application (for example, component 220 can have a circular, oval, cylindrical or conical geometry, such as that of a region or surface of a mechanical gear or shaft).

In embodiments, such as previously described, a TIM can be utilized to form a thermal coupling between a heat sink and a heat source. Accordingly, the example of FIG. 2C depicts TIM 224 interspersed between heat sink assembly 200 and component 220. Also as previously described, in an embodiment a TIM can have a cure temperature at or above the actuation temperature of a shape memory material utilized in springs among springs 204.

With reference again to the example of FIG. 2C, in embodiments an actuation energy applied to, or transferred to, shaping element 204 (e.g., transferred to springs among springs 204) can transform springs among springs 204 from the compressed, assembly shape, depicted in FIG. 2B, to the extended, actuation shape, depicted in FIG. 2A, to produce the convex thermal coupling shape of heat sink base 208 illustrated in FIG. 2C. For example, heating heat sink assembly 200, heat sink 206, springs among springs 204, TIM 224, and/or and combination of these and/or component 220 to a temperature (e.g., a cure temperature of TIM 224) above an actuation temperature of springs among springs 204 (e.g., an actuation temperature of nitinol) can cause springs among springs 204 to transform from the compressed assembly shape, illustrate in FIG. 2B to the extended actuation shape illustrated in FIG. 2A.

As previously described, in embodiments a shaping element taking an actuation shape can produce a corresponding change in shape and/or configuration of a heat sink to effect and/or improve a thermal coupling between the heat sink and a heat source. Accordingly, as illustrated by the example FIG. 2C, in an embodiment springs 204 taking the extended actuation shape illustrated in FIG. 2A can produce a convex shape in heat sink base 208 of heat sink 206. For example, as springs among springs 204 transform to the extended actuation shape, the extended springs can exert a shaping force between load plate 202 and the upper surface of heat sink base 208 to produce the convex thermal coupling shape of heat sink base 208 depicted in FIG. 2C.

In an embodiment, the convex thermal coupling shape of the heat sink base 208 depicted in FIG. 2C can, in turn, direct contact between heat sink 204 and TIM 224 and/or component 220 along a linear, or circular (e.g., in the case that springs 204 are configured within heat sink assembly 200, when in their extended actuation shape, to shape heat sink base 208 into a circular, vs elongated, dome) region of TIM 224 and/or component 220. In the example of component 220 comprising an electronic integrated circuit, directing contact between heat sink base 208 and component 220 to a linear or circular region of component 220 can improve thermal coupling between heat sink 204 and a higher temperature region of component 220 (as compared to the temperature of other regions of the surface of component 220 in contact with TIM 224 and/or heat sink 204).

While the examples of FIGS. 2A, 2B, and 2C depict springs 204 comprising three springs in a linear arrangement within heat sink assembly 200, this is not intended to limit embodiments. It would be apparent to one of ordinary skill in the art that embodiments can utilize more, or fewer, than 3 shape memory elements (such as springs among springs 204) to form a shaping element in a heat sink assembly, that the shape memory elements can be other than twisted or coiled springs depicted in these Figures (e.g., such shaping element can be shafts, or columns, that can expand or contract, in response to an actuation energy), and that a plurality of shape memory elements comprising a shaping element of a heat sink assembly can be organized in various configurations other than a linear configuration, such as shown in FIGS. 2A-2C, according to the geometry of a heat sink, and/or heat sink base, suitable for a particular application and/or heat source.

Figure 3A:
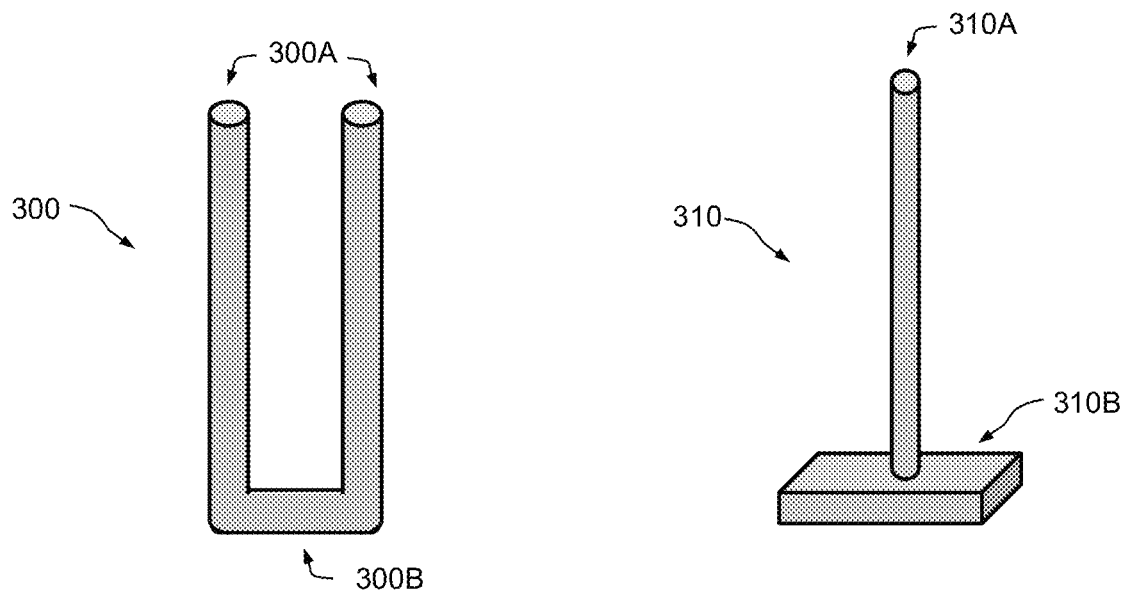
FIG. 3A illustrates example heat pipes, according to aspects of the disclosure.

Embodiments can employ a "heat pipe" heat sink, which can comprise one or more "heat pipes" to transfer heat away from a heat source. FIG. 3A illustrates example heat pipes, 300 and 310, that can be employed, in embodiments, to form a heat pipe heat sink. In FIG. 3A, heat pipe 300 comprises coolant pipes 300A coupled with heat pipe base 300B in a "U" shape. In embodiments, one or both of coolant pipes 300A and/or heat pipe base 300B can contain a coolant (e.g., a thermally conductive gas or liquid) for distributing heat away from heat pipe 300. For example, coolant pipes 300A and/or heat pipe base 300B can contain a cavity (e.g., be hollow) that can contain a coolant. In heat pipe 300, coolant pipes 300A and heat pipe base 300B, in embodiments can be interconnected, to allow a coolant to flow between them.

FIG. 3A further illustrates an alternative example embodiment of a heat pipe, heat pipe 310, comprising coolant pipe 310A and heat pipe base 310B. As just described with reference to heat pipe 300, in an embodiment coolant pipe 310A and/or heat pipe base 310B can contain a coolant, such as in a cavity of coolant pipe 310A and/or heat pipe base 310B, and coolant pipe 310A and heat pipe base 310B can be interconnected to allow a coolant to flow between them.

Figure 3B:
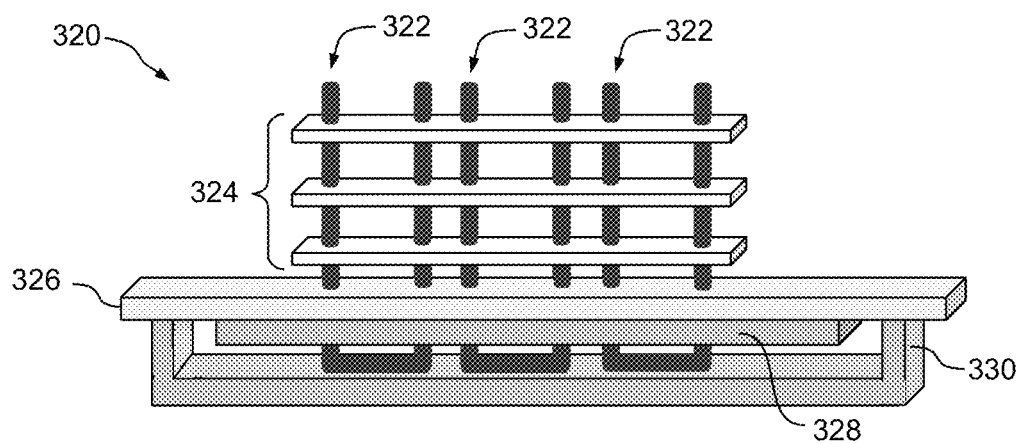
FIG. 3B illustrates an example heat pipe heat sink assembly, according to aspects of the disclosure.

FIG. 3B depicts an example embodiment of a heat pipe heat sink assembly utilizing a shaping element, according to aspects of the disclosure. FIG. 3B depicts example heat pipe heat sink assembly 320, comprising heat pipes 322, fins 324, load plate 326, shaping element 328, and heat sink 330. As previously described, in embodiments a load plate can serve to mount elements of a heat sink assembly, and/or to facilitate a shaping element exerting a shaping force on a heat sink (e.g., a shaping force on a heat sink base of a heat sink). Accordingly, in the example of heat sink assembly 320 in FIG. 3B, in an embodiment load plate 326 can serve to mount elements of heat sink assembly 320, such as shaping element 328, heat pipes among 322 and/or fins among 324, and/or heat sink 330. A heat pipe heat sink assembly, such as the example of heat pipe heat sink assembly 320 FIG. 3B, in embodiments, can effect and/or improve a thermal coupling between a heat sink and a heat source.

As described in reference to FIG. 3A, in an embodiment a heat pipe, such as among heat pipes 322, can contain and/or convey a coolant within them. In embodiments coolant within heat pipes can remove heat from a heat source and/or heat sink assembly when the heat sink assembly is thermally coupled to a heat source. For example, in an embodiment heat pipes 322 in FIG. 3A can be heat pipes according to the examples of heat pipes 300 and/or 310 in FIG. 3B. For purposes only of describing the example of FIGS. 3B, 3C, and 3D, but not intended to limit embodiments, heat pipes among heat pipes 322 can each be considered to comprise "U" shaped heat pipes according to the example of heat pipe 300 in FIG. 3A.

As shown in FIG. 3B, heat pipes 322 can be thermally coupled to (e.g., in direct contact with) heat sink 330, such that heat pipes among heat pipes 322 can transfer heat away from heat sink 330. In an embodiment, heat pipes, among heat pipes 322, can contain a coolant to transfer heat away from, for example, a heat pipe base (e.g., 300B, according to the example of heat pipe 300 in FIG. 3A) of a heat pipe, and/or heat sink 330 in heat sink assembly 320. As also shown in FIG. 3A, in embodiments heat pipes 322 can be also thermally coupled to (e.g., in contact with) fins 324, and fins 324 can dissipate heat conveyed within heat pipes 322 to another medium, such as a gas or liquid, surrounding and/or in contact with fins 324. In an embodiment, fins 324 can themselves can have a cavity, and can be coupled to (or, alternatively, be integral with) a cavity of heat pipes 322, such that a gas or liquid conveyed within heat pipes 322 can flow also through (e.g., into and out of) fins 324. Heat pipes 322, fins 324, heat sink 330, and/or a coolant contained in heat pipes among heat pipes 322, can comprise a thermally conductive material, such as a metal, gas or liquid (in the case of a coolant) or other material having suitable thermally conductive properties.

As previously described, in embodiments a shaping element can comprise a shape memory material and can have an actuation shape and an assembly shape. Accordingly, shaping element 328, in FIG. 3B, can comprise a shape memory material. For purposes only of illustrating the disclosure, but not intended to limit embodiments, FIG. 3B depicts shaping element 328 in a flat, plate assembly shape similar to that of shaping element 100 in FIG. 1B. The example of FIG. 3B further depicts shaping element 328 configured in heat sink assembly 320 between load plate 326 and heat pipe bases of heat pipes 322. In an embodiment, in such a configuration load plate 326 can provide a base for shaping element 328, in an actuation shape, to exert a shaping force against the heat pipe bases of heat pipes among 322 and/or heat sink 330.

For example, FIG. 3B further depicts shaping element 328 coupled to load plate 326 at a bottom surface of load plate 326 and coupled to heat pipes 322 above the base of heat pipes 322. In an embodiment, such a configuration can facilitate a shaping element exerting a force on heat pipes (i.e., exerting a force on a heat pipe base) in the process of the shaping element transforming from an assembly shape to an actuation shape. To illustrate, in an embodiment shaping element 328 can have the plate assembly shape illustrated in FIG. 3B and have a convex actuation shape, such as illustrated by the dome actuation shape of shaping element 100 in FIG. 1A. Accordingly, as will be seen in the ensuing description of FIGS. 3C and 3D, in transforming from the plate assembly shape of FIG. 3B to a convex actuation shape, shaping element 328 can exert a force on the heat pipe bases of heat pipes among heat pipes 322 in FIG. 3B, and this shaping force can transfer from the bases of heat pipes among 322 to heat sink 330.

Figure 3C:
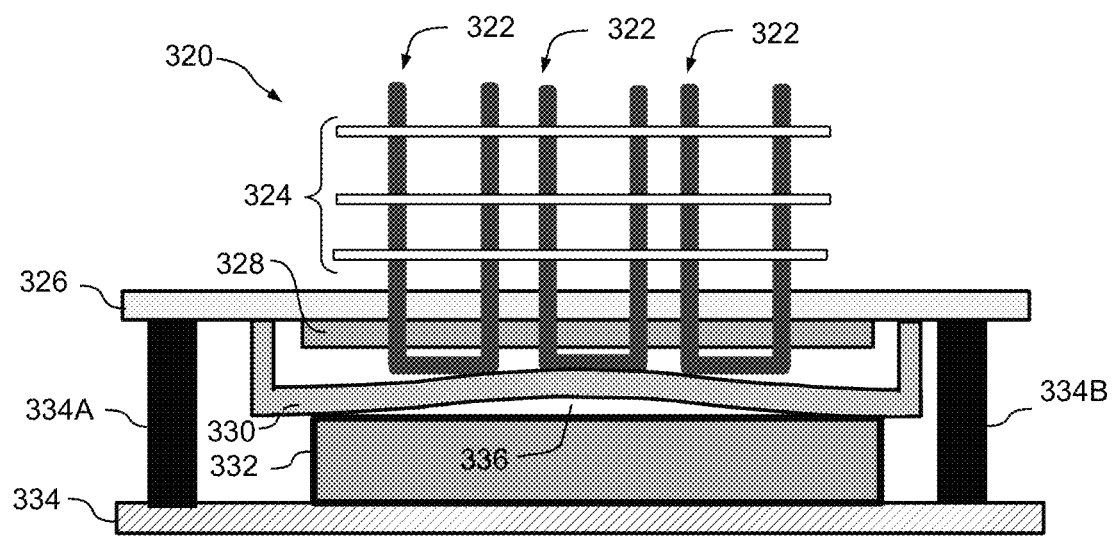
FIG. 3C illustrates an example heat pipe heat sink assembly in an assembly shape of a shaping element, according to aspects of the disclosure.

FIG. 3C illustrates example heat sink assembly 320, of FIG. 3B, coupled to a heat source, device 332. In FIG. 3C, device 332 is mounted on substrate 334 and heat sink assembly 320 is mounted in contact with device 332. In an embodiment, device 332 can be, for example, an electronic device (e.g., an integrated circuit, such as a processor) or a mechanical device (e.g., a gear, a shaft, or a brake assembly) that can generate heat. Substrate 334, in an embodiment, can be, for example, a printed circuit board or a mechanical housing or mount. While not intended to limit embodiments, and for only purposes of illustrating the disclosure, FIG. 3C depicts heat sink assembly 320 mounted on substrate 334 by means of load plate 326 mounted to mounting posts 334A and 334B. FIG. 3C further depicts shaping element 328 in the plate assembly shape illustrated in FIG. 3B.

FIG. 3C illustrates an example case in which, in an embodiment, a heat sink assembly (e.g., heat sink 330 of heat sink assembly 320) can be thermally coupled to a heat source (e.g., in contact with device 332) with reduced thermal efficiency (i.e., a lower quality thermal coupling). As can be seen in the example of FIG. 3C, in a "direct contact" thermal coupling to device 332, heat sink assembly 332 (e.g., heat sink 330) can have incomplete physical contact (e.g., a gap or void) with device 332, such as gap 336 between device 332 and heat sink 330. In embodiments, such a gap can occur, for example, as a result of fabricating heat sink 330, and/or surfaces of device 332 intended to be in contact with a heat sink or heat sink base. In the example of FIG. 3C, heat sink 330 is shown having a concave (with respect to the surface of device 332 in contact with heat sink 332) heat sink base, which can produce gap 336.

While not shown in the example of FIG. 3B, in an embodiment, a heat sink base (e.g., 330) and/or other elements of a heat sink assembly (e.g., element of heat sink assembly 320), can be coupled (thermally and/or mechanically) to a heat source (e.g., device 332) using a TIM. In such embodiments, a gap, such as 336, can be present between a TIM and a heat source, and/or between a TIM and heat sink base or element of a heat sink assembly, and the gap can reduce thermal efficiency of the heat sink in transferring heat from the heat source. For example, heat sink 330 having the concave shape illustrated in FIG. 3C can great a gap, similar to 336, between heat sink 330 and a TIM interspersed between heat sink 330 and device 332.

Figure 3D:
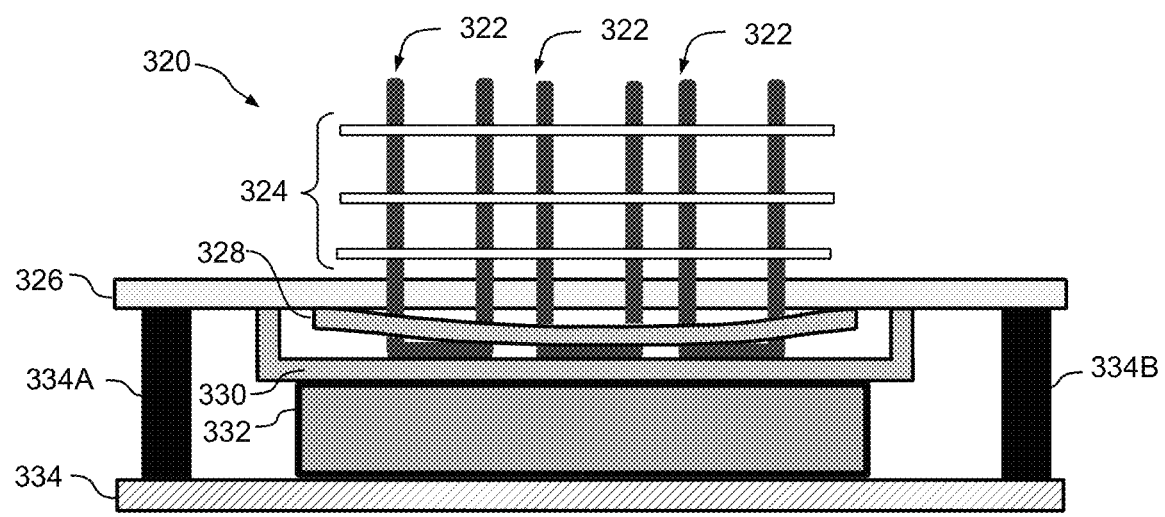
FIG. 3D illustrates an example heat pipe heat sink assembly in an actuation shape of a shaping element, according to aspects of the disclosure.

As previously described, in embodiments shaping element 328 can comprise a shape memory material and can have an actuation shape different from the assembly shape of FIGS. 3B and 3C. Accordingly, in an embodiment shaping element 328 can have an actuation shape which, in heat sink assembly 320, can exert a shaping force on elements of heat sink assembly 320. To illustrate, FIG. 3D depicts example heat sink assembly 320 of FIGS. 3B and 3C, as coupled to device 332 in FIG. 3B, with shaping element 328 in an actuation shape. While not intended to limit embodiments, and only for purposes of illustrating the disclosure, as, in an embodiment shaping element 328 is shown in FIG. 3D having a convex (e.g., elongated or circular dome) actuation shape.

In the example embodiment of FIG. 3D, a convex actuation shape of shaping element 328 can exert a shaping force downward on heat pipe bases of heat pipes among 322, and the shaping force can be transferred from heat pipes 322 to heat sink 330 so as to produce a thermal coupling shape (as illustrated, a corresponding convex thermal coupling shape) in heat sink 330. Such a thermal coupling shape in heat sink 330 can, for example, press heat sink 330 against device 332 so as to remove (or, alternatively, diminish) a void or gap, such as gap 336 of FIG. 3C, between heat sink 330 and device 332. Similarly, in an embodiment utilizing a TIM to thermally couple heat sink assembly 320 (or, elements thereof) to device 332, a shaping force exerted by shaping element 328 on heat pipes 322, and transferred to heat sink 330, can produce a thermal coupling shape in heat sink 330 that can remove, or diminish, a void or gap between the TIM and one or both of heat sink 330 and device 336.

In embodiments, as previously described, applying an actuation energy (e.g., applying heat, electrical current, or a magnetic field) to a heat sink assembly (or, elements thereof) can cause a shaping element to change from an assembly shape to an actuation shape. In an embodiment following the examples of FIGS. 3C and 3D, heating one or more of device 332, elements of heat sink assembly 320, and/or a TIM used in coupling heat sink assembly 320 and device 332, can apply an actuation energy (e.g., heat at a temperature at or above a shape memory temperature of shaping element 328) to transform shaping element 328 from the plate assembly shape of FIG. 3C to the convex actuation shape of FIG. 3D.

Figure 4:
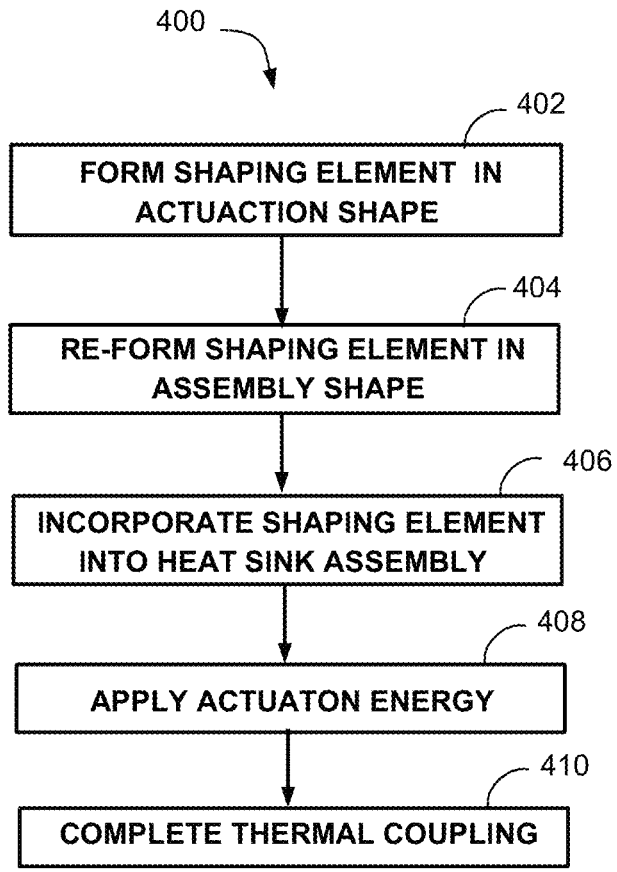
FIG. 4 is a flowchart that illustrates an example method to form a heat sink assembly and thermal coupling to a heat source, according to aspects of the disclosure.

Having in mind the foregoing examples of FIG. 1A-3D, it will be appreciated by one of ordinary skill in the art that embodiments can employ a method to thermally couple a heat source and a heat sink assembly utilizing a shaping element, comprising a shape memory material, in the heat sink assembly. FIG. 4 illustrates example method 400 for thermally coupling a heat sink assembly and heat source utilizing such a shaping element in a heat sink assembly. In embodiments, utilizing a shaping element according to the example method can effect and/or improve thermal efficiency of a thermal coupling between a heat sink and a heat source. In the description of method 400, "the coupling process" refers to any process, in an embodiment, incorporating elements of the disclosure to form a thermal coupling between a heat sink assembly and a heat source, utilizing a shaping element in a heat sink assembly to produce a thermal coupling shape in an element (e.g., a heat sink base) of the heat sink assembly.

In FIG. 4, at 402 of example method 400 the coupling process forms a shaping element, comprising a shape memory material—such as shape memory materials previously described—in an actuation shape. In embodiments, at 402 the coupling process can form a shaping element in an actuation shape comprising, for example, a convex, concave, elongated or circular dome, and/or extended spring shapes such as previously described. However, these particular shape memory materials and actuation shapes are not intended to limit embodiments, and it would be evident to one of ordinary skill in the art that, in an embodiment, a shaping element can comprise any material having shape memory properties and can be formed in any shape suitable to produce a thermal coupling shape in a heat sink, TIM, and/or heat source, having a particular geometry, configuration, and/or subject to particular thermal coupling defects (e.g., a gap in surface contact) that can reduce thermal efficiency of a thermal coupling.

In an embodiment, at 402 the coupling process can produce an actuation shape in a shape memory material of a shaping element by a variety of means, such as mechanical forging (e.g., heating and shaping at high temperature) and/or milling a shape memory material, or sputtering or deposing a shape memory material on a mold or fixture that has the desired actuation shape (e.g., a dome, or an extended spring). It would be apparent to one of ordinary skill in the art, in an embodiment, to apply a fabrication process that achieves a particular actuation shape of a shaping element, and/or shape memory material, according to properties of a particular shape memory metal, geometries and/or configurations of a particular shaping element, and/or geometries and/or configurations of a particular heat sink assembly and/or heat source.

At 404, the coupling process re-forms the shaping element from an actuation shape, such as fan actuation shape formed at 402, into an assembly shape. In embodiments, as previously described, an assembly shape of a shaping element can be any 3-dimensional shape, in any configuration, suitable for incorporating the shaping element into a heat sink assembly, such as the flat, plate assembly shapes of FIGS. 1B and 3B, or the compressed spring assembly shape of FIG. 2B. At 404, embodiments can use a variety of means (e.g., mechanical forging, pressing, and/or molding) that do not apply an actuation energy to the shaping element, or the shape memory material of a shaping element, to re-form a shaping element from an actuation shape to an assembly shape. For example, using a shaping element comprising a particular shape memory material that transforms to the actuation shape at a particular temperature (e.g., a curing temperature of a TIM), at 404 the coupling process can re-form the shaping element from an actuation shape to an assembly shape at a temperature (e.g., room temperature) less than the actuation temperature of that shape memory material.

At 406, the coupling process incorporates the shaping element into a heat sink assembly. As illustrated by the examples of FIGS. 1B, 2B, and 3B, in embodiments a heat sink assembly can include a shaping element and, optionally, a load plate, in a heat sink assembly of various geometries and methods of operation. In embodiments, the coupling process can, at 406, employ a variety of methods to couple, or bond, the shaping element with other elements of a heat sink assembly, such as attaching the shaping element mechanically (e.g., screws, tabs, or other fasteners) to other elements of the heat sink assembly; soldering or welding the shaping element to one or more other elements of the heat sink assembly; and/or bonding the shaping element to other elements of the heat sink assembly with an adhesive.

At 408, the coupling process applies an actuation energy to the shaping element. As previously described, in an embodiment at 408 an actuation energy can be heat (e.g., heat to cure a TIM), electrical current, mechanical energy, and/or magnetic energy. At 408, the coupling process, in an embodiment, can apply the actuation energy with the heat sink assembly coupled to a heat source and can, at 408, apply the actuation energy to the heat source, the heat sink, an element of the heat sink assembly, and/or a TIM used in coupling the heat sink and a heat source, in any manner that transfers the activation energy to the shaping element, and/or a shape memory material of the shaping element.

In embodiments, applying the actuation energy, at 408, can transform the shaping element from the assembly shape to the actuation shape, and the shaping element transforming to the actuation shape can produce a thermal coupling shape in the heat sink. As previously described, in embodiments the thermal coupling shape of the heat sink can effect, and/or improve, a thermal coupling between the heat sink and a heat source. Accordingly, at 408 in an embodiment the coupling process can apply the actuation energy with the heat sink assembly coupled to a heat source.

Alternatively, at 408 the coupling process, in an embodiment, can apply the actuation energy with the heat sink assembly not coupled to a heat source and can, at 408, apply the actuation energy to the heat sink, an element of the heat sink assembly, and or the shaping element itself, and subsequently, at 408 (or, as will be seen, at 410) couple the heat sink assembly, with the shaping element in an actuation shape and the heat sink, correspondingly, in the actuation shape, to a heat source. For example, in an embodiment, subsequent to the actuation shape of the shaping element producing, at 408, the thermal coupling shape in the heat sink, the heat sink may retain the thermal coupling shape (e.g., the heat sink may become permanently formed, at 408, in the thermal coupling shape) or, an embodiment can, at 408, continue to apply an actuation energy, to maintain the heat sink in the thermal coupling shape, until the heat sink and heat source are thermally, or otherwise, coupled.

At 410, the coupling process completes forming the thermal coupling between the heat sink and the heat source. In an embodiment, at 410 the coupling process completing forming the thermal coupling between the heat sink and the heat source can include, for example, removing the actuation energy from the shaping element, heat sink, heat sink assembly, a TIM (e.g., cooling a TIM), and/or heat source. As just described with reference to operation 408, an embodiment, at 410, can include coupling (thermally or otherwise) a heat sink in a thermal coupling shape to a heat source. Embodiments can, at 410, perform operations to further bond a heat sink (and/or other elements of a heat sink assembly) to a heat source, such as mechanically joining a heat sink to a heat source (by screws or pressure plates, for example), and/or bonding a heat sink to a heat source with an adhesive, weld, or solder, It would be apparent to one of ordinary skill in the art to perform, at 410, any particular operations necessary to complete forming a thermal coupling between a heat sink and a heat source according to the requirements of a particular application.

The descriptions of the various embodiments of the disclosure have been presented for purposes of illustration but are not intended to be exhaustive or to limit embodiments to the embodiments disclosed. Many modifications and variations will be apparent to those of ordinary skill in the art without departing from the scope and spirit of the described embodiments. The terminology used herein was chosen to explain the principles of the embodiments, the practical application or technical improvement over technologies found in the marketplace, or to enable others of ordinary skill in the art to understand the embodiments disclosed herein.

What is claimed is:

1. A method for coupling a heat sink and a heat source, the method comprising:
    forming a shaping element, comprising a shape memory material, in an actuation shape of the shaping element;
    re-forming the shaping element from the actuation shape into an assembly shape, the assembly shape suitable for incorporating the shaping element in a heat sink assembly;
    coupling the shaping element to the heat sink within the heat sink assembly;
    coupling the heat sink assembly to the heat source; and
    applying an actuation energy to the shaping element, wherein the actuation energy applied to the shaping element causes the shape memory material to change the shaping element from the assembly shape to the actuation shape, and wherein the shaping element changing from the assembly shape to the actuation shape produces a thermal coupling shape in the heat sink.

2. The method of claim 1, wherein the heat sink assembly further comprises a load plate; and,
    wherein the method further comprises coupling the shaping element to the load plate within the heat sink assembly to facilitate the shaping element exerting the shaping force on the heat sink.

3. The method of claim 1, wherein the applying the actuation energy to the shaping element comprises applying the actuation energy to at least one of the shaping element, the heat sink, the heat sink assembly, and the heat source.

4. The method of claim 1, wherein the actuation energy comprises at least one of heat, electrical energy, mechanical energy, and magnetic energy.

5. The method of claim 1, wherein the actuation shape comprises a convex shape.

6. The method of claim 1, wherein the shape memory material comprises a metal alloy having a shape memory property.

7. The method of claim 1, wherein the method applying the actuation energy to the shaping element comprises applying the actuation energy to the shaping element with the heat sink coupled to the heat source.

8. The method of claim 7, wherein the heat sink coupled to the heat source comprises a Thermal Interface Material (TIM) coupled to the heat source and the heat sink assembly;
    wherein the TIM has a cure temperature;
    wherein shape memory material comprises a material that changes the shaping element to the actuation shape at a temperature less than the cure temperature of the TIM; and,
    wherein the applying the actuation energy to the heat sink comprises heating the TIM to at least the cure temperature of the TIM.

9. The method of claim 1, wherein the forming the shaping element into the actuation shape comprises forming the shaping element using a fixture.

10. The method of claim 1, wherein the forming the shaping element in the actuation shape comprises forming the shaping element in the actuation shape by heating the shaping element to a temperature above an actuation temperature of the shape memory material.

* * * * *